United States Patent [19]

Smothers

[11] Patent Number: 4,917,977

[45] Date of Patent: Apr. 17, 1990

[54] VISIBLE SENSITIZERS FOR PHOTOPOLYMERIZABLE COMPOSITIONS

[75] Inventor: William K. Smothers, Hockessin, Del.

[73] Assignee: E. I. du Pont de Nemours and Company, Wilmington, Del.

[21] Appl. No.: 289,119

[22] Filed: Dec. 23, 1988

[51] Int. Cl.$^4$ .................. G03H 1/04; G03C 1/68
[52] U.S. Cl. .............................. 430/1; 430/2;
430/281; 430/907; 430/915; 430/916; 430/945;
430/325; 522/11; 522/14; 522/26; 522/34;
522/63; 522/50
[58] Field of Search ............ 430/281, 915, 916, 2,
430/1, 323, 324, 576, 325, 945; 522/11, 34, 50,
14, 26, 63

[56] References Cited

U.S. PATENT DOCUMENTS

| | | | |
|---|---|---|---|
| 887,029 | 6/1971 | Ulbing et al. | 430/576 |
| 3,099,558 | 7/1963 | Levinos | 522/26 |
| 3,528,812 | 9/1970 | Danhauser et al. | 522/50 |
| 3,554,753 | 1/1971 | Cohen | 96/90 |
| 3,652,275 | 3/1972 | Baum et al. | 96/48 |
| 3,672,906 | 6/1972 | Brooker et al. | 96/142 |
| 3,787,213 | 1/1974 | Gervay et al. | 430/324 |
| 3,925,077 | 12/1975 | Lewis et al. | 430/323 |
| 3,971,664 | 7/1976 | Nakazawa et al. | 430/2 |
| 4,162,162 | 7/1979 | Dueber | 96/115 P |
| 4,269,933 | 5/1981 | Pazos | 430/291 |
| 4,454,218 | 6/1984 | Dueber et al. | 430/277 |
| 4,772,530 | 9/1988 | Gottschalk et al. | 430/138 |
| 4,772,541 | 9/1988 | Gottschalk et al. | 430/339 |
| 4,824,765 | 4/1989 | Sperry et al. | 430/281 |
| 4,855,213 | 8/1989 | Logan | 430/281 |

OTHER PUBLICATIONS

D. F. Eaton, "Dye Sensitized Photopolymerization", Adv. in Photochemistry, vol. 13, D. H. Volman, G. S. Hammond, & K. Gollinick, eds., Wiley-Interscience, NY, 1986, pp. 427-487.

Primary Examiner—Paul R. Michl
Assistant Examiner—Christopher D. RoDee

[57] ABSTRACT

A photosensitive composition comprising:
(a) a compound of the formula

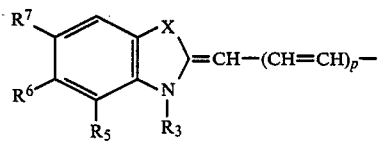

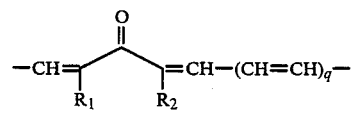

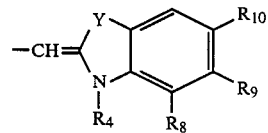

(b) an ethylenically unsaturated compound capable of free radical initiated addition polymerization;
(c) a polymeric binder; and
(d) a free radical generating system activatable by actinic radiation which comprises a hexaarylbiimidazole and a chain transfer agent.

A single step process for forming a light-stable hologram using this photosensitive composition is also disclosed.

16 Claims, No Drawings

VISIBLE SENSITIZERS FOR PHOTOPOLYMERIZABLE COMPOSITIONS

FIELD OF THE INVENTION

This invention relates to new sensitizers for photopolymerizable compositions that absorb in the visible region of the spectrum. More particularly, this invention pertains to photopolymerizable compositions initiated by selected methine dyes.

BACKGROUND OF THE INVENTION

Much work has been done in the field of photopolymerizable compositions to increase the speed of these materials. However, many of the well-known photoinitiators or photoinitiator systems limit the applicability of photopolymerizable compositions because they are activatible primarily by radiation in the ultraviolet region of the spectrum. The availability of reliable, relatively inexpensive lasers which emit in the visible region of the spectrum has made it desirable to develop initiator systems for photopolymerizable materials which are sensitive to visible radiation. Such applications include the use of supported photopolymerizable layers for preparing graphic arts films and proofs, printing plates, photoresists, holograms and the like such as are disclosed in the following U.S. Patents: Alles, U.S. Pat. No. 3,458,311; Celeste, U.S. Pat. No. 3,469,982; Chu et al., U.S. Pat. No. 3,649,268; Haugh, U.S. Pat. No. 3,658,526; Chen et al., U.S. Pat. No. 4,323,637; Dueber, U.S. Pat. No. 4,162,162; Bratt et al., U.S. Pat. No. 4,173,673; Cohen et al., U.S. Pat. No. 4,282,308; and Dueber, U.S. Pat. No. 4,613,560. In addition these lasers can be used in output devices for electronic imaging systems.

A large number of free-radical generating systems have been utilized as visible sensitizers for photopolymerizable compositions. Redox systems, especially those involving dyes, e.g., Rose Bengal/2-dibutylaminoethanol, have been used. Photoreducible dyes and reducing agents such as those disclosed in U.S. Pat. Nos. 2,850,445; 2,875,047; 3,097,096; 3,074,974; 3,097,097; 3,145,104; and 3,579,339; as well as dyes of the phenanzine, oxazine, and quinone classes have been used to initiate photopolymerization. Initiation by ionic dye-counter ion complexes and by cationic dye-borate anion complexes is described in Gottschalk et al., U.S. Pat. Nos. 4,772,530 and 4,772,541. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427-487.

Dueber, U.S. Pat. No. 4,162,162, as well as U.S. Pat. Nos. 4,268,667 and 4,351,893, discloses selected sensitizers derived from aryl ketones and p-dialkylaminoaldehydes. Dueber and Monroe, U.S. Pat. No. 4,565,769, discloses photopolymerizable compositions containing polymeric sensitizers which are activatible by visible radiation. Baum and Henry, U.S. Pat. No. 3,652,275, discloses selected bis(p-dialkylaminobenzylidene)ketones as sensitizers to enhance the efficiency of hexaarylbiimidazole initiator systems in photopolymerizable compositions. Cohen, U.S. Pat. No. 3,554,753, discloses selected carbocyanine dyes as sensitizers of hexaarylbiimidazole containing imaging systems.

The use of visible sensitizers is crucial for the preparation of holograms in photopolymerizable and photocrosslinkable systems such as are disclosed in Haugh, U.S. Pat. No. 3,658,526. While suitable sensitizers are available for use in these systems, there is a need for other sensitizers which closely match the spectral laser outputs used, particularly in the regions extending into the yellow, red and infrared portions of the spectrum.

Lasers are also being used to image photopolymerizable resists during the manufacture of printed circuits, optical storage media and the like. While UV and some visible lasers can be used in current systems, there is a need for extended sensitivity photoresists so that high resolution images can be prepared to survive the rigorous processing conditions encountered during manufacture of high quality printed circuits.

SUMMARY OF THE INVENTION

It is an object of this invention to provide photopolymerizable initiating systems having extended sensitivity in the longer wavelength visible spectral regions. It is a further object of this invention to provide such extended spectral sensitizers that are matched to the spectral output of laser systems used in imaging photopolymerizable or photocrosslinkable materials.

These objects and others are satisfied by an improved photohardenable composition having extended spectral response comprising:

(1) a compound of the formula

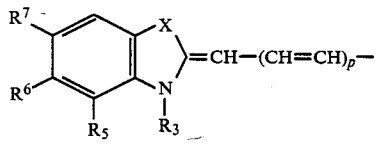

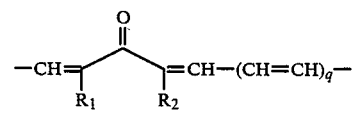

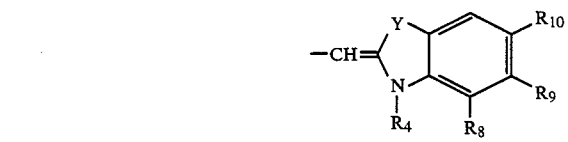

wherein:

p and q are each independently 0 or 1;

$R_1$ and $R_2$ are H, or $R_1 + R_2$ is $-(CHR_{11}CHR_{12})-$ or $-(CH_2CHR_{13}CH_2)-$, where $R_{11}$ and $R_{12}$ are each either hydrogen or joined to form an aromatic ring and $R_{13}$ is either H or an alkyl group of about 1 to about 6 carbon atoms;

$R_3$ and $R_4$ are each independently alkyl groups of about 1 to about 6 carbon atoms or substituted or unsubstituted phenyl;

X and Y are each independently O, S, Se, $NR_{14}$, or $CR_{15}R_{16}$, where $R_{14}$, $R_{15}$, and $R_{16}$ are each independently alkyl groups of about 1 to about 6 carbon atoms or substituted or unsubstituted phenyl; and $R_5$, $R_6$, $R_7$, $R_8$, $R_9$, and $R_{10}$ are each independently alkyl groups of about 1 to about 6 carbon atoms, alkoxy groups of about 1 to about 6 carbon atoms, substituted or unsubstituted phenyl, chlorine, or bromine, with the proviso that $R_5$ and $R_6$ together or $R_6$ and $R_7$ together and that independently $R_8$ and $R_9$ together or $R_9$ and $R_{10}$ together may be joined to form an aliphatic or aromatic ring;

(2) an ethylenically unsaturated monomer capable of free radical initiated addition polymerization; and (3) a chain transfer agent.

In a preferred embodiment of this invention p and q are each equal to zero; X and Y are identical and equal to S or $C(CH_3)_2$; $R_1 + R_{b\ 2}$ is $—(CH_2)_2—$ or $—(CH_2CHR_{13}CH_2)—$, where $R_{13}$ is H or t-butyl; $R_3$ and $R_4$ are identical and equal to $CH_3$ or $C_2H_5$; $R_7$ and $R_{10}$ are hydrogen; and $R_5$ and $R_6$ are each either hydrogen or joined to form an aromatic ring and $R_8$ and $R_9$ are each either hydrogen or joined to form an aromatic ring. In a more preferred embodiment of this invention $R_1 + R_2$ is $—(CH_2)_2—$.

In a preferred embodiment of this invention the composition also contains a polymeric binder. In a more preferred embodiment of this invention the composition also contains an initiator system activatible by actinic radiation. In an even more preferred embodiment of this invention the initiator system contains a hexaarylbiimidazole.

DETAILED DESCRIPTION OF THE INVENTION

Photohardenable Compositions

The novel compositions of this invention are photohardenable systems which are initiated by free radicals generated by actinic radiation. Typically, photohardening proceeds by free radical initiated addition polymerization and/or crosslinking of ethylenically unsaturated monomeric compounds. While the photohardenable systems contain the requisite chain transfer agent and/or photoinitiating system as well as monomeric compounds along with the sensitizers of this invention, the system may contain other constituents for a specific use. Such constituents include stabilizers, adhesion and coating agents, and the like. Photohardenable systems wherein the compounds of this invention are particularly useful are holographic photopolymer materials and dry film photoresist materials.

Sensitizers

The sensitizers of this invention have the structure:

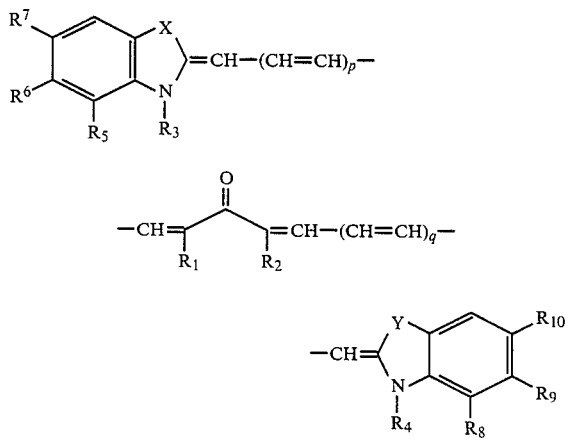

wherein
p and q are each independently 0 or 1;
$R_1$ and $R_2$ are H, or $R_1 + R_2$ is $—(CHR_{11} CHR_{12})—$ or $—(CH_2CHR_{13}CH_2)—$, where $R_{11}$ and $R_{12}$ are each either hydrogen or joined to form an aromatic ring and $R_{13}$ is either H or an alkyl groups of about 1 to about 6 carbon atoms;

$R_3$ and $R_4$ are each independently alkyl groups of about 1 to about 6 carbon atoms or substituted or unsubstituted phenyl;

X and Y are each independently O, S, Se, $NR_{14}$, or $CR_{15}R_{16}$, where $R_{14}$, $R_{15}$, and $R_{16}$ are each independently alkyl groups of about 1 to about 6 carbon atoms or substituted or unsubstituted phenyl; and $R_5$, $R_6$, $R_7$, $R_8$, $R_9$, and $R_{10}$ are each independently alkyl groups of about 1 to about 6 carbon atoms, alkoxy groups of about 1 to about 6 carbon atoms, substituted or unsubstituted phenyl, chlorine, or bromine, with the proviso that $R_5$ and $R_6$ together or $R_6$ and $R_7$ together and that independently $R_8$ and $R_9$ together or $R_9$ and $R_{10}$ together may be joined to form an aliphatic or aromatic ring.

The sensitizers of this invention are illustrated by sensitizers S-1 to S-7.

In a preferred embodiment of this invention p and q are each equal to zero; X and Y are identical and equal to S or $C(CH_3)_2$; $R_1 + R_2$ is $—(CH_2)_2—$ or $—(CH_2CHR_{13}CH_2)—$, where $R_{13}$ is H or t-butyl; $R_3$ and $R_4$ are identical and equal to $CH_3$ or $C_2H_5$; $R_7$ and $R_{10}$ are hydrogen; and $R_5$ and $R_6$ are each either hydrogen or joined to form an aromatic ring and $R_8$ and $R_9$ are each either hydrogen or joined to form an aromatic ring. The preferred sensitizers of this invention are illustrated by sensitizers S-1, S-2, S-3, S-5, and S-6.

In a more preferred embodiment of this invention $R_1 + R_2$ is $—(CH_2)_2—$. The more preferred sensitizers of this invention are illustrated by sensitizers S-1, S-2, and S-3.

The sensitizers of this invention may be used individually or in combination with other members of the same class of compositions or with other sensitizing compositions, such as those disclosed in U.S. Pat. Nos. 3,652,275; 4,162,162; 4,268,667; 4,351,893; 4,535,052; 4,565,769; and the like. The use of two or more such compositions can effect sensitization over a broader spectral range to match a variety of laser output radiation.

Initiator Systems

A large number of free-radical generating compounds can be utilized in the practice of this invention. Preferred initiator systems are 2,4,5-triphenylimidazolyl dimers with hydrogen donors, also known as the 2,2',4,4',5,5'-hexaarylbiimidazoles or HABI's, and mixtures thereof, which dissociate on exposure to actinic radiation to form the corresponding triarylimidazolyl free radicals. These hexaarylbiimidazoles absorb maximally in the 255–275 nm region of the spectrum, and usually show some, though lesser absorption in the 300–375 nm region. Although the absorption bands tend to tail out to include wavelengths as high as 430 nm, these compounds normally require light rich in the 255–375 nm region of the spectrum for their dissociation.

HABI's and use of HABI-initiated photopolymerizable systems have been previously disclosed in a number of patents. These include Chambers, U.S. Pat. No. 3,479,185; Chang et al., U.S. Pat. No. 3,549,367; Baum and Henry, U.S. Pat. No. 3,652,275; Cescon, U.S. Pat. No. 3,784,557; Dueber, U.S. Pat. No. 4,162,162; Dessauer, U.S. Pat. No. 4,252,887; Chambers et al., U.S. Pat. No. 4,264,708; and Tanaka et al., U.S. Pat. No.

4,459,349. Useful 2,4,5-triarylimidazolyl dimers are disclosed in Baum and Henry, U.S. Pat. No. 3,652,275 column 5, line 44 to column 7, line 16.

The HABI's can be represented by the general formula

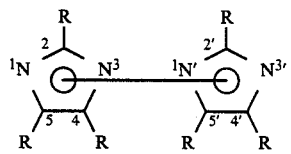

where the R's represent aryl radicals.

Preferred HABI's are 2-o-chlorosubstituted hexaphenylbiimidazoles in which the other positions on the phenyl radicals are unsubstituted or substituted with chloro, methyl or methoxy. The most preferred initiators include CDM-HABI, i.e., 2-(o-chlorophenyl)4,5-bis(m-methoxyphenyl)-imidazole dimer; o-Cl- HABI, i.e., 1,1'-biimidazole, 2,2'-bis (o-chlorophenyl)-4,4',5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

Processes for producing HABI compounds result in a mixture of isomers and other impurities. Use of high concentrations of these impure materials can provide photopolymerizable compositions with high sensitivity but poor shelflife or storage stability due to crystallization. It has been found that purification of the materials by various methods can provide relatively pure materials. The HABI's can be purified sufficiently for use in this invention by merely dissolving them in methylene chloride, filtering and recrystallizing by adding methanol or ether. If desired, the solution of the HABI in methylene chloride can be eluted through a silica gel column prior to recrystallization.

Chain Transfer Agents

Conventional chain transfer agents, or hydrogen donors, can be used herein with HABI-initiated photopolymerizable systems. For example, Baum and Henry, U.S. Pat. No. 3,652,275, lists N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis(mercaptoacetate), 4-acetamidothiophenol, mercaptosuccinic acid, dodecanethiol, and beta-mercaptoethanol. Others which can be used include various tertiary amines known in the art, 2-mercaptoethane sulfonic acid, 1-phenyl-4H-tetrazole-5-thiol, 6-mercaptopurine monohydrate, bis(5-mercapto-1,3,4-thiodiazol-2-yl, 2-mercapto-5-nitrobenzimidazole, and 2-mercapto-4-sulfo-6-chlorobenzoxazole. Other hydrogen donor compounds useful as chain transfer agents in photopolymer compositions include various other types of compounds, e.g., (a) ethers, (b) esters, (c) alcohols, (d) compounds containing allylic or benzylic hydrogen, e.g., cumene, (e) acetals, (f) aldehydes, and (g) amides, as disclosed in column 12, lines 18 to 58, of MacLachlan, U.S. Pat. No. 3,390,996.

For photopolymerizable compositions which contain the monomer N-vinyl carbazole and similar compounds, the preferred chain transfer agents are: 5-chloro-2-mercaptobenzothiazole; 2-mercaptobenzothiazole (2-MBT); 1-H-1,2,4-triazole-3-thiol; 6-ethoxy-2-mercaptobenzothiazole; 4-methyl-4H-1,2,4-triazole-3-thiol; and 1-dodecanethiol. Except for systems which contain the monomer N-vinyl carbazole, the preferred chain transfer agents are 2-mercaptobenzoxazole (2-MBO) and 2-mercaptobenzthiazole (2-MBT).

Monomers

Contemplated monomers include those which form both water-soluble and water-insoluble polymers. Typical monomers are alkylene or polyalkylene glycol diacrylate prepared from an alkylene glycol of 2 to 15 carbons or a polyakylene ether glycol of 1 to 10 ether linkages, and those disclosed in Martin and Barney, U.S. Pat. No. 2,927,022, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

The following specific compounds are illustrative of this class: unsaturated esters of alcohols, preferably polyols and particularly such of the α-methylene carboxylic acids, e.g., ethylene glycol diacrylate, diethylene glycol diacrylate, glycerol diacrylate, glycerol triacrylate, ethylene glycol dimethacrylate, 1,3 propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,3-pentanediol dimethacrylate, the bisacrylates and methacrylates of polyethylene glycols of molecular weight 200–500, and the like; unsaturated amides, particularly those of the α-methylene carboxylic acids, and especially those of α-Ω-diamines and oxygen-interrupted Ω-diamines, such as methylene bis-acrylamide, methylene bismethacrylamide, methylene bis-methacrylamide, 1,6-hexamethylene bis-acrylamide, diethylene triamine tris-methacrylamide, bis(δ-methacrylamidopropoxy) ethane β-methacrylamidoethyl methacrylate, N-(β-hydroxyethyl)-β-(methacrylamido) ethyl acrylate and N,N-bis(β-methacrylamido) ethyl acrylate and N,N-bis(β-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate, styrene and derivatives thereof and unsaturated aldehydes, such as sorbaldehyde (hexadienal).

An outstanding class of these preferred addition polymerizable components are the esters and amides of α-methylene carboxylic acids and substituted carboxylic acids with polyols and polyamines wherein the molecular chain between the hydroxyls and amino groups is solely carbon or oxygen-interrupted carbon. The preferred monomeric compounds are polyfunctional, but monofunctional monomers can also be used. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of polyhydroxy compounds such as pentaerythritol and trimethylolpropane, and acrylic and methacrylic esters of adducts of ethylene oxide and polyhydroxy compounds such as those described in Cohen and Schoenthaler, U.S. Pat. No. 3,380,831, are also useful. The photocrosslinkable polymers disclosed in Schoenthaler, U.S. Pat. No. 3,418,295, and Celeste, U.S. Pat. No. 3,448,089, may also be used. The amount of monomer added varies with the particular polymer used. Other useful ethylenically unsaturated compounds are the ethylenically unsaturated diester polyhydroxy polyethers described in U.S. Pat. Nos. 3,661,576, 3,373,075 and 3,637,618.

Binders

For the purpose of this invention a binder is a preformed macromolecular polymeric or resin material typically having a molecular weight above 1000. Suitable binders include the following: polymers and copolymers of acrylate and α-alkyl acrylate esters, e.g., polymethyl methacrylate and polyethyl methacrylate; polymers and copolymers of vinyl esters and their hydrolysis and partial hydrolysis products, e.g., polyvinyl acetate, polyvinyl acetate/acrylate, polyvinyl acetate/methacrylate and hydrolyzed polyvinyl acetate; ethylene/vinyl acetate copolymers; styrene polymers and copolymers, with, e.g., maleic anhydride, or acrylate and methacrylate esters; vinylidene chloride copolymers, e.g., vinylidene chloride/acrylonitrile, vinylidene chloride/methacrylate, and vinylidene chloride/vinyl acetate; vinyl chloride polymers and copolymers, e.g., vinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene and styrene/isoprene/styrene block copolymers; polyepoxides having average molecular weights from about 4,000 to 1,000,000; copolyesters, e.g., those prepared from the reaction product of a polymethylene glycol of the formula $HO(CH_2)_nOH$, where n is an integer of from 2 to 10 inclusive, with (1) hexahydroterephthalic, sebacic and terephthalic acids, (2) terephthalic, isophthalic and sebacic acids, (3) terephthalic and sebacic acids, (4) terephthalic and isophthalic acids, or (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetals, e.g., polyvinyl butyral, polyvinyl formal; and polyformaldehydes. Suitable binders for use in the photopolymerizable compositions of this invention also include those disclosed in Fryd et al., U.S. Pat. No. 4,726,877; Kempf, U.S. Pat. No. 4,716,093; Briney et al., U.S. Pat. No. 4,517,281; Leberzammer et al., U.S. Pat. No. 4,353,978; Chen et al., U.S. Pat. No. 4,323,637; Flint et al., U.S. Pat. No. 4,293,635; Cohen et al., U.S. Pat. No. 4,282,308; Gervay et al., U.S. Pat. No. 4,278,752; Celeste, U.S. Pat. No. 3,770,438; Haugh, U.S. Pat. No. 3,658,526; Chu et al., U.S. Pat. No. 3,649,268; and Celeste, U.S. Pat. No. 3,469,982.

In the preferred stable, solid, photopolymerizable compositions adapted for the preparation of holograms, the binder and the monomer are selected so that either the binder or the monomer contains one or more moieties taken from the group consisting essentially of substituted or unsubstituted phenyl, phenoxy, naphthyl, naphthyloxy, and heteroaromatic groups containing up to three aromatic rings; chlorine; and bromine. The remaining component is substantially free of these specified moieties. In the instance when the monomer contains these moieties, the photopolymerizable system hereinafter is identified as a "Monomer Oriented System" and when the polymeric material contains these moieties, the photopolymerizable system hereinafter is identified as a "Binder Oriented System".

The monomer of a Monomer Oriented System is a compound capable of addition polymerization and having a boiling point above 100° C. which contains one or more moieties taken from the group consisting essentially of a substituted or unsubstituted phenyl, phenoxy, naphthyl, naphthyloxy, and heteroaromatic groups containing up to three aromatic rings; chlorine; and bromine. The monomer contains at least one such moiety and may contain two or more of the same or different moieties of the group. Particularly preferred liquid monomers for use in the Monomer Orientated System are 2-phenoxyethyl acrylate, 2-phenoxyethyl methacrylate, phenol ethoxylate acrylate, 2-(p-chlorophenoxy)ethyl acrylate, p-chlorophenyl acrylate, phenyl acrylate, 2-phenylethyl acrylate, the di(2-acryloxyethyl)ether of bisphenol-A, ethoxylated bisphenol-A diacrylate, and 2-(1-naphthyloxy)ethyl acrylate. While these monomers are liquid, they may be used in admixture with a solid monomer such as N-vinyl carbazole; ethylenically unsaturated carbazole monomers such as disclosed in *Journal of Polymer Science: Polymer Chemistry Edition*, Vol. 18, pages 9–18 (1979) by H. Kamogawa et al.; 2-naphthyl acrylate; pentachlorophenyl acrylate; 2,4,6-tribromophenyl acrylate; bisphenol-A diacrylate; 2-(2-naphthyloxy)ethyl acrylate; and N-phenyl maleimide.

Particularly preferred binders for use in the Monomer Oriented System of this invention are cellulose acetate butyrate polymers; acrylic polymers and inter polymers including polymethyl methacrylate, methyl methacrylate/methacrylic acid and methyl methacrylate/acrylic acid copolymers, terpolymers of methylmethacrylate/$C_2$–$C_4$ alkyl acrylate or methacrylate/acrylic or methacrylic acid; polyvinyl acetate; polyvinyl acetal; polyvinyl butyral; and polyvinyl formal; as well as mixtures thereof.

The monomer of a Binder Oriented System is a compound capable of addition polymerization having a boiling point above 100° C. which is substantially free of moieties taken from the group consisting essentially of substituted or unsubstituted phenyl, phenoxy, naphthyl, naphthyloxy, and heteroaromatic groups containing up to three aromatic rings; chlorine; and bromine. Particularly preferred monomers for use in Binder Oriented Systems include decanediol diacrylate, iso-bornyl acrylate, triethylene glycol diacrylate, diethylene glycol diacrylate, triethylene glycol dimethacrylate, ethoxyethoxyethyl acrylate, the triacrylate ester of ethoxylated trimethylolpropane, and 1-vinyl-2-pyrrolidione.

The solvent soluble polymeric material or binder of the Binder Oriented System contains in its polymeric structure moieties taken from the group consisting essentially of substituted or unsubstituted phenyl, phenoxy, naphthyl, naphthyloxy, and heteroaromatic groups containing up to three aromatic rings; chlorine; and bromine. The moieties may form part of the monomeric units which constitute the polymeric binder or may be grafted onto a preformed polymer or interpolymer. The binder of this type may be a homopolymer or it may be an interpolymer of two or more separate monomeric units wherein at least one of the monomeric units contains one of the moieties identified above. Particularly preferred binders for use in the Binder Oriented System include polystyrene, poly(styrene/acrylonitrile), poly(styrene/methyl methacrylate), and polyvinyl benzal as well as admixtures thereof.

Other Components

A wide range of nonpolymerizable plasticizers are effective in achieving improved exposure and development temperature latitude. When a macromolecular binder is present in the layer, plasticizer would be selected which is compatible with the binder as well as the ethylenically unsaturated monomer and other components of the composition. With acrylic binders, for example, plasticizers can include dibutyl phthalate and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; low molecular weight polyesters of poly-$\alpha$-methylstyrenes; chlorinated paraffins; and sulfonamide types can be used. In general, water insoluble plasticizers are preferred for greater high humidity storage stability, but are not necessary to get improved latitude.

Many ethylenically unsaturated monomers are subject to thermal polymerization, especially when stored for long periods or at elevated temperatures. When such compounds are supplied commercially, it is customary for them to contain a small amount of a thermal polymerization inhibitor. These inhibitors can be left in the monomers when the photopolymerizable compositions of this invention are prepared, as was done in the Examples which follow. The resulting compositions usually have satisfactory thermal stability. If unusual thermal exposure is anticipated, or if monomers containing little or no thermal polymerization inhibitor are employed, compositions with adequate shelf life can be obtained by incorporating, at about 1 to 500 ppm by weight of monomer, of a thermal polymerization inhibitor. Useful thermal stabilizers include: hydroquinone, phenidone, p-methoxyphenol, alkyl and aryl-substituted hydroquinones and quinones, tert-butyl catechol, pyrogallol, copper resinate, naphthylamines, betanaphthol, cuprous chloride, 2,6-di-tert-butyl p-cresol, phenothiazine, pyridine, nitrobenzene, dinitrobenzene, p-toluquinone and chloranil. The dinitroso dimers described in Pazos, U.S. Pat. No. 4,168,982 are also useful. A preferred reversible thermal stabilizer is TAOBN, i.e., 1,4,4-trimethyl-2,3-diazobicyclo(3.2.2)-non-2-ene-2,3-dioxide.

By the incorporation of optical brightening agents into the photopolymerizable layer, the image record is produced free from distortion due to halation effects. Suitable optical brighteners useful in the process of the invention include those disclosed in, U.S. Pat. Nos. 2,784,183; 3,664,394; and 3,854,950. Specific optical brighteners which are particularly useful in the photopolymerizable elements of this invention are 2-(stilbyl-4'')-(naphto-1',2',4,5)-1,2,3-triazol-2''-sulfonic acid phenyl ester and 7-(4'-chloro-6'-diethyl-amino-1',3',5'-triazine-4'-yl)amino-3-phenyl coumarin. Ultraviolet radiation absorbing materials useful in the invention are also disclosed in U.S. Pat. No. 3,854,950.

Compounds which have been found useful as release agents may also be incorporated in film compositions such as are described in Bauer, U.S. Pat. 4,326,010. A preferred release agent is polycaprolactone.

Other inert additives can be employed such as dyes, pigments and fillers. These additives are generally present in minor amounts so as not to interfere with the exposure of the photopolymerizable layer.

Substrates/Coating/Exposure

The photopolymerizable compositions can be coated onto a wide variety of substrates. By "substrate" is meant any natural or synthetic support, preferable one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. For example, when printed circuits are produced, the substrate may be a plate which is a copper coating on fiberboard; in the preparation of lithographic printing plates, the substrate may be anodized aluminum. Specific substrates include alumina-blasted aluminum, anodized aluminum, alumina-blasted polyethylene terephthalate film, polyethylene terephthalate film, e.g., resin-subbed polyethylene terephthalate film, polyvinyl alcohol-coated paper, cross-linked polyester-coated paper, nylon, glass, cellulose acetate film, heavy paper such as lithographic paper, and the like.

Any convenient source or sources of actinic radiation providing wavelengths in the region of the spectrum that overlap the absorption bands of the photosensitizer can be used to activate photopolymerization. The radiation can be natural or artificial, monochromatic or polychromatic, incoherent or coherent, and for high efficiency should correspond closely in wavelength to the absorption of the initiator system.

Conventional light sources include fluorescent lamps, mercury, metal additive and arc lamps providing narrow or broad light bands centered near 405, 436 and 546 nm. Coherent light sources are xenon, argon ion, and ionized neon lasers, as well as tunable dye lasers and the frequency doubled neodymium:YAG laser, whose emissions fall within or overlap the visible absorption bands of the sensitizer. For the exposure of holographic photopolymer systems coherent light sources, i.e., lasers, which emit in the visible are preferred. Particularly preferred are the helium-neon (HeNe) laser, the argon-ion laser, the krypton-ion laser, and the frequency doubled neodymium:YAG laser.

When broad spectrum light sources are used to form an image from negative separation transparencies in a two exposure system using a nitroaromatic photoinhibitor compound, it is necessary to filter out the radiation in the spectral range above 400 nm during the initial, imagewise exposure. A filter capable of transmitting radiation in the spectral range of 315 to 380 nm and absorbing radiation in the spectral range 400 to 550 is described is Looney, U.S. Pat. No. 4,167,490. Such positive working processes are described in Pazos, U.S. Pat. No. 4,198,242; Dueber, U.S. Pat. No. 4,162,162; and Dueber and Nebe, U.S. Pat. No. 4,477,556.

Holographic Recording Systems

The term "image recording" is conventionally taken to mean a process which produces a spatial pattern of optical absorption in the recording medium. Photographic processes are well known examples of this type of process.

In a broader sense, however, the word "image" means a spatial variation of the optical properties of a sample in such a way as to cause a desired modification of a beam of light passing through, or reflecting from, the sample. Refractive index images in general and holograms in particular, which modulate the phase, rather than the amplitude, of the beam passing through them are usually referred to as phase holograms. Phase holographic image recording systems produce a spatial pattern of varying refractive index rather than optical absorption in the recording medium and, thus, can modulate a beam of light without absorbing it. This type of refractive index image formation also includes a number of optical elements or devices, such as holographic lenses, gratings, mirrors, and optical waveguides, which superficially bear little resemblance to absorption images.

Holography is a form of optical information storage. The general principles are described in a number of references, e.g., "Photography by Laser" by E. N. Leith and J. Upatnieks in *Scientific American*, 212, No. 6, 24–35 (June, 1965). A useful discussion of holography is presented in "Holography", by C. C. Guest, in *Encyclopedia of Physical Science and Technology*, Vol. 6, pp. 507–519, R. A. Meyers, Ed., Academic Press, Orlando, Fla., 1987. In brief, the object to be photographed or imaged is illuminated with coherent light (e.g., from a laser) and a light sensitive recording medium (e.g., a photographic plate) is positioned so as to receive light reflected from the object. This beam of reflected light is known as the object beam. At the same time, a portion of the coherent light is directed to the recording medium, bypassing the object. This beam is known as the reference beam. The interference pattern that results from the interaction of the reference beam and the object beam impinging on the recording medium is recorded in the recording medium. When the processed recording medium is subsequently appropriately illuminated and observed at the appropriate angle, the light from the illuminating source is diffracted by the hologram to reconstruct the wavefront that originally reached the recording medium from the object. Thus, the hologram resembles a window through which the virtual image of the object is observed in full three-dimensional form, complete with parallax.

Holograms that are formed by allowing the reference and object beams to enter the recording medium from the same side are known as transmission holograms. Interaction of the object and reference beams in the recording medium forms fringes of material with varying refractive indices which are approximately normal to the plane of the recording medium. When the hologram is played back by viewing with transmitted light, these fringes refract the light to produce the viewed virtual image. Such transmission holograms may be produced by methods which are well known in the art, such as disclosed in Leith and Upatnieks, U.S. Pat. Nos. 3,506,327; 3,838,903 and 3,894,787.

Holograms formed by allowing the reference and object beams to enter the recording medium from opposite sides, so that they are traveling in approximately opposite directions, are known as reflection holograms. Interaction of the object and reference beams in the recording medium forms fringes of material with varying refractive indices which are, approximately, planes parallel to the plane of the recording medium. When the hologram is played back these fringes act as partial mirrors reflecting incident light back to the viewer. Hence, the hologram is viewed in reflection rather than in transmission.

Reflection holograms may be produced by an on-axis method wherein the beam of coherent radiation is projected through the recording medium onto an object therebehind. In this instance, the reflected object beam returns and intersects with the projected beam in the plane of the recording medium to form fringes substantially parallel to the plane of the medium. Reflection holograms also may be produced by an off-axis method wherein a reference beam is projected on one side of the recording medium and an object beam is projected on the reverse side of the medium. In this instance the object beam is formed by illuminating the object with coherent radiation which has not passed through the recording medium. Rather, the original beam of coherent radiation is split into two portions, one portion being projected on the medium and the other portion being manipulated to project on the object behind the medium. Reflection holograms produced by an off-axis process are disclosed in U.S. Pat. No. 3,532,406.

A holographic mirror is the simplest possible reflection hologram. It can be created by splitting a single laser beam and recombining the beams at the recording medium, or the unsplit laser beam can be projected through the medium onto a plane mirror therebehind. A set of uniformly spaced fringes with a sinusoidal-like intensity distribution is formed which are oriented parallel to the bisector of the obtuse angle between the two beams propagating in the recording medium. If the obtuse angle is 180° and the beams are normal to the plane of the medium, the fringes will be parallel to the plane of the medium. If the two beams do not make equal angles with the normal to the plane of the medium, then the fringes which are formed will be slanted at an acute angle relative to the plane of the medium. The holographic mirror can be characterized by its wavelength of maximum reflection and by its reflection efficiency, that is the percent of incident radiation which is reflected at its wavelength of maximum reflection.

Industrial Applicability

The photopolymerizable compositions of this invention show good visible light sensitization which allows them to be exposed with a variety of visible light sources, especially visible lasers. The broad sensitization range coupled with the effectiveness of the sensitization enables polymeric images, which may be further processed by development to produce resist images or other relief images, to be formed. These compositions are useful in printing plates for offset and letter press, engineering drafting films, as well as photoresists in liquid or dry film form for making printed circuits or in chemical milling or in solder masks. Certain compositions of this invention are particularly useful for the formation of holograms in which sensitivity to visible lasers is required. Other specific uses will be evident to those skilled in the art.

Syntheses

The sensitizers of this invention can be prepared by base catalyzed Claisen-Schmidt condensation of two equivalents of the appropriate aldehyde with one equivalent of the appropriate ketone. The synthetic procedure is exemplified by the preparation of sensitizer S-3 described in Example 2. The synthesis of Sensitizers S-1, S-2, and S-3 by the hydrolysis of carbocyanine dyes is described in Booker et al., U.S. Pat. No. 3,672,906. The synthesis of dyes S-1, S-3, S-4, S-5, and S-7 by the condensation of azotium salts with ketones is described in Slominskii, et al., *Kihm. Geterotsikl. Soedin.*, 711–712 (1974)[*Chem. Abst.*, 81, 77828f (1974)].

The intermediate aldehydes used in the Claisen-Schmidt condensation can be prepared by the well-known Vilsmeier reaction. The procedure is exemplified by the preparation of 2(3-ethyl-2-benzothiazolinylidine)acetaldehyde, the aldehyde used in the preparation of dye S-1.

The advantageous properties of the compositions and processes of this invention can be observed by reference to the following examples which illustrate, but do not limit, the invention.

EXAMPLES

| | |
|---|---|
| o-Cl-HABI | 1,1'-Biimidazole, 2.2'-bis[o-chlorophenyl]-4,4',5,5'-tetraphenyl-; CAS 1707-68-2 |
| Fluorad ® FC-431 | Fluoroaliphatic polymeric esters, 50% by weight solution in ethyl acetate; 3M Company, St. Paul, MN. |
| MBO | 2-Mercaptobenzoxazole; 2-Benzoxazolethiol; CAS 2382-96-9 |
| MMT | 4-Methyl-4H-1,2,4-triazole-3-thiol; CAS 24854-43-1 |
| TAOBN | 1,4,4-Trimethyl-2,3-diazobicyclo (3.2.2)-non-2-ene-2,3-dioxide |
| NVC | N-Vinylcarbazole; 9-Vinylcarbazole; CAS 1484-13-5 |
| Photomer ® 4039 | Phenol ethoxylate monoacrylate; CAS 56641-05-5; Henkel Process Chemicals Company |
| Sartomer ® 349 | Ethoxylated bisphenol A diacrylate; CAS 24447-78-7; Sartomer Chemical Company, |
| Sensitizer S-1 | Cyclopentanone, 2,5-bis[2-(3-ethyl-2(3H)-benzothiazolylidene)ethylidene]-; CAS 27714-24-5 |
| Sensitizer S-2 | Cyclopentanone, 2,5-bis [2-(1-ethylnaphtho[1,2-d]thiazol-2-(1H)-ylidene)ethylidene]-; CAS 27714-25-6 |
| Sensitizer S-3 | Cyclopentanone, 2,5-bis[2-(1,3-dihydro-1,3,3-trimethyl-2H-indol-2-ylidene)ethylidene]-; CAS 27713-85-5 |
| Sensitizer S-4 | 2H-Inden-2-one, 1,3-bis[2-(1,3-dihydro-1,3,3-trimethyl-2H-indol-2-ylidene)ethylidene]-1,3-dihydro-; CAS 53115-05-2 |
| Sensitizer S-5 | Cyclohexanone, 2,5-bis[2-(1,3-dihydro-1,3,3-trimethyl-2H-indol-2-ylidene)ethylidene]; CAS 53115-04-1 |
| Sensitizer S-6 | Cyclohexanone, 2,6-bis[2-(1,3-dihydro-1,3,3-trimethyl-2H-indol-2-ylidene)ethylidene-5-(1,1-dimethyethyl) |
| Sensitizer S-7 | 2,5-Heptadien-4-one, 1,7-bis(1,3-dihydro-1,3,3-trimethyl-2H-indol-2-ylidene)-; CAS 53115-03-0 |
| Vinac ® B-100 | Poly(vinyl acetate), MW 500,000; CAS 9003-20-7; Air Products Company, Allentown, Pa. |

S-1
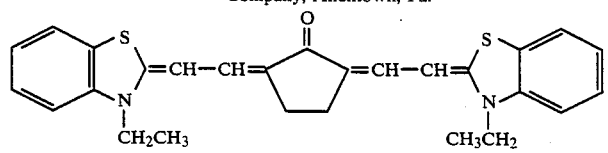

S-2
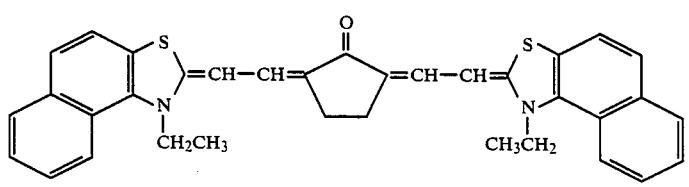

-continued

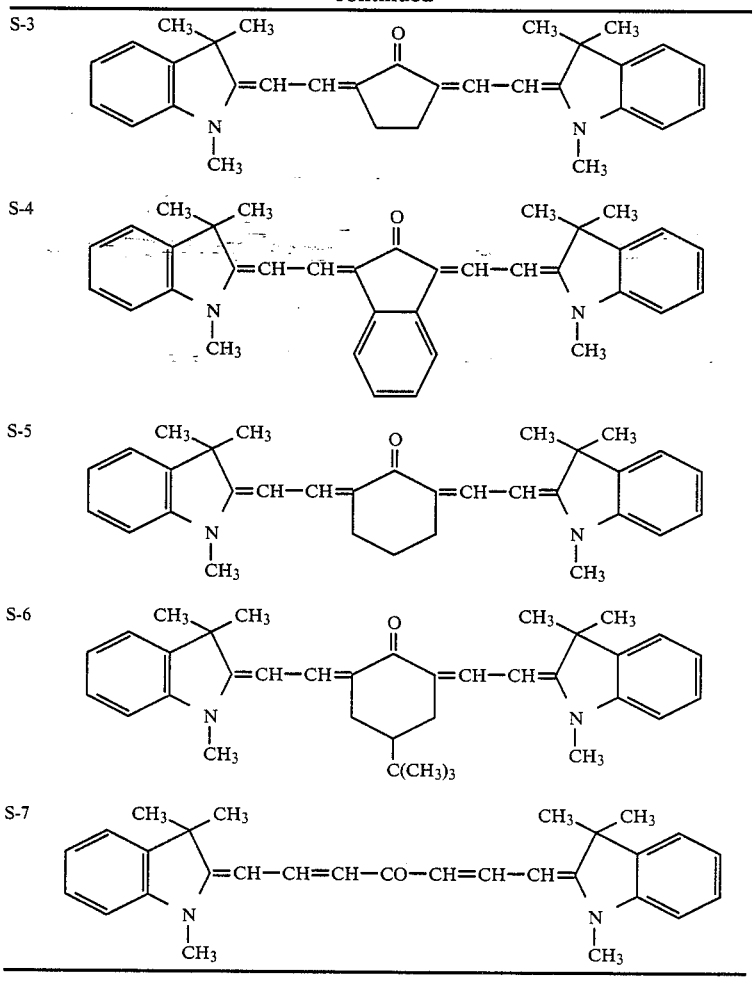

EXAMPLE 1

Aromatic aldehydes were prepared by the Vilsmeier reaction. The general procedure is exemplified with the preparation of 2-(3-ethyl-2-benzothiazolinylidine)acetaldehyde, the aldehyde used in the synthesis of sensitizer S-1.

Synthesis of 2-(3-ethyl-2(3H)-benzothiazolinylidine)acetaldehyde (CAS 41471-32-3)

A 500 mL four-neck round-bottom flask equipped with mechanical stirrer, dropping addition funnel, and nitrogen purge is charged with 50 mL of N,N-dimethylformamide and cooled to 5°-10° C. in an ice bath. Phosphorous oxychloride (26.3 g, 0.17 mol) is added dropwise, and a solution of 3-ethyl-2-methylbenzothiazolium p-toluenesulphonate (50 g, 0.14 mol) in 250 mL of N,N-dimethylformamide is added slowly while maintaining the reaction temperature at 10°-20° C. Pyridine (25 mL) is added and the reaction is stirred at 10°-15° C. for 10 minutes and then heated to 65°-75° C. for 15 min. After the reaction mixture is cooled to 10°-15° C., 100 mL of water is added. Then potassium hydroxide (75 g) dissolved in 50 ml of water is added slowly and the reaction heated at 35°-45° C. for 30 min. The reaction mixture is then decanted from inorganic precipitates into a separatory funnel and extracted with dichloromethane. The dichloromethane extract solution is washed with water and then dried with saturated aqueous sodium chloride and anhydrous sodium sulphate. Dichloromethane, traces of N,N-dimethylformamide, and pyridine are removed by vacuum distillation to give 24.8 g (84%) of product as a reddish brown gum which analyzes pure by proton NMR.

EXAMPLES 2-8

Sensitizers were prepared by Claisen-Schmidt condensation in tert-butyl alcohol using potassium tert-butoxide, two equivalents of aromatic aldehyde, and one equivalent of the appropriate ketone. Ketones used include: cyclopentanone (sensitizers S-1, S-2, and S-3), 2-indanone (S-4), cyclohexanone (S-5), 4-tert-butylcyclohexanone (S-6), and acetone (S-7). Sensitizer structure was verified by proton nuclear magnetic resonance spectroscopy. The general synthetic procedure is exemplified with the preparation of sensitizer S-3. The melting points and absorption maxima are listed in Table I.

Synthesis of sensitizer S-1

A 1.0 liter three-neck round-bottom flask fitted with a reflux condenser, mechanical stirrer and nitrogen purge is charged with 500 mL of tert-butyl alcohol and 37 g of potassium tert-butoxide (0.33 mol). The mixture is stirred for approximately 30 min to dissolve the potassium tert-butoxide. Fisher's aldehyde [(1,3-dihydro-1,3,3-trimethyl-2H-indol-2-ylidene)acetaldehyde; CAS 84-83-3] (60 g, 0.3 mol) is added, the reaction mixture is heated to reflux, and cyclopentanone (12.5 g, 0.15 mol) is added slowly over 80–90 min. After refluxing 12–14 h, 100 mL of water is added, the reaction is cooled to room temperature, and the solid product collected by filtration and washed with cold methanol and dried under vacuum to yield 47.6 g (71%) of dark maroon crystals. mp 262°–263° C.

TABLE I

| Sensitizer | Melting Point (°C.)[a] | $\lambda_{max}$[b] (nm) | $\epsilon_{max}$[b] |
|---|---|---|---|
| S-1 | 240–242 | 556 | 108,000 |
| S-2 | 270–271 | 582 | 106,000 |
| S-3 | 262–263 | 520 | 103,000 |
| S-4 | 210–235 | 498 | 68,000 |
| S-5 | 269–271 | 503 | 85,500 |
| S-6 | 280–283 | 502 | 78,700 |
| S-7 | 205–207 | 494 | 73,000 |

[a]literature: S-1, 246–247° C.; S-2, 275–276° C.; S-3, 265–266° C. (Brooker et al, U.S. Pat. No. 3,672,906).
[b]in dichloromethane.

GENERAL PROCEDURES

Sample Preparation

Coating solutions without visible-light sensitizer were prepared in amber bottles under yellow or red light by adding components to the solvent and mixing with a mechanical stirrer until completely dissolved. The solvent was a mixture of dichloromethane (95% by weight) and methanol (5%). All components were used as received from suppliers without further purification. After addition of sensitizer, all operations on solutions and their resulting coatings were performed under red light only.

Solutions were coated onto a 2 or 4 mil thick clear film support of polyethylene terephthalate at a speed of 8 ft/min using a Talboy coater equipped with an 8 mil doctor knife, 12 ft drier set at 50°–70° C., and a laminator station. A cover sheet of 0.9 mil polyethylene terephthalate was laminated to the coatings as they emerged from the drier. Dry coating thicknesses are 17–27 microns.

Sample Evaluation

Coated film was cut into 4×5 in sections, the cover sheet was removed, and the film mounted by laminating the tacky coating directly onto a clear glass plate. The 2–4 mil polyethylene terephthalate film support was left in place during subsequent handling, exposure, and thermal processing steps.

Coatings mounted on glass plate were evaluated by recording holographic mirrors and determining their reflection efficiency as a function of wavelength and exposure. Holographic mirrors were formed by first tightly clamping the coating-plate to a front-surface aluminum mirror with a thin xylene layer between the glass plate and the mirror and then exposing to a collimated 514 nm argon-ion laser beam oriented perpendicular to the film plane and passing, in order, through the film support, coating, glass plate, and xylene layer and then reflecting back onto itself. In a few cases, holographic mirrors were formed as just described except using the 632.8 nm line of a helium-neon laser. In all cases, the laser beam had a 1.5–3.0 cm diameter and an intensity of 3–10 mW/cm$^2$. Laser exposure times varied from 0.3–400 sec, corresponding to an exposure range of 3–4000 mJ/cm$^2$.

After laser exposure, the aluminum mirror and xylene were removed and the coating was overall exposed to ultraviolet and visible light from a Theimer-Strahler #5027 mercury-arc photopolymer lamp (Exposure Systems Corp., Bridgeport, CT) mounted in a Douthitt DCOP-X exposure unit (Douthitt Corp., Detroit, MI). The coating was then thermally processed by heating to 100° C. for 30–35 min in a forced-air convection oven, after which the transmission spectrum of each holographic mirror was recorded using a standard spectrophotometer (Perkin Elmer model Lambda-9). Maximum reflection efficiency was measured from the transmission spectra. Graphs of reflection efficiency versus total laser exposure were used to determine photospeed, defined as the minimum exposure required to obtain maximum holographic reflection efficiency.

EXAMPLES 9–12

These examples demonstrate and compare use of Sensitizer S-3 in compositions with and without HABI, and without NVC. The formulations described in Table II were prepared, coated, and evaluated according to the general procedures given above. Results are given in Table II.

TABLE II

| Ingredient (g) | Example | | | |
|---|---|---|---|---|
| | 9 | 10 | 11 | 12 |
| Dichloromethane | 76.0 | 76.0 | 76.0 | 76.0 |
| Methanol | 4.0 | 4.0 | 4.0 | 4.0 |
| Sensitizer S-3 | 0.014 | 0.014 | 0.014 | 0.014 |
| Fluorad ® FC-431 | 0.08 | 0.08 | 0.08 | 0.08 |
| MMT | 0.60 | 0.60 | — | — |
| MBO | — | — | 0.60 | 0.60 |
| o-Cl HABI | 0.60 | — | 0.60 | — |
| Sartomer ® 349 | 0.80 | 0.80 | 0.80 | 0.80 |
| Photomer ® 4039 | 5.00 | 5.60 | 5.00 | 5.60 |
| Vinac ® B-100 | 12.93 | 12.93 | 12.93 | 12.93 |
| 514 nm Exposure | | | | |
| Maximum Reflection Efficiency | 91% | 9% | 91% | 15% |
| Photospeed (mJ/cm$^2$) | 40 | 4000+ | 40 | 4000+ |

EXAMPLES 13–20

These examples demonstrate and compare use of Sensitizers S-1 through S-7 in compositions containing both HABI and NVC. Examples 5 and 7 also demonstrate film sensitization to the 632.8 nm line of the helium-neon laser. The formulations described in Table III were prepared, coated, and evaluated according to the general procedures. Results are given in Tables III and IV.

TABLE III

| Ingredient (g) | Example | | | |
|---|---|---|---|---|
| | 13 | 14 | 15 | 16 |
| Dichloromethane | 152.0 | 152.0 | 152.0 | 152.0 |
| Methanol | 8.0 | 8.0 | 8.0 | 8.0 |
| S-1 | 0.056 | 0.048 | — | — |
| S-2 | — | — | 0.040 | — |
| S-3 | — | — | — | 0.028 |
| Fluorad ® FC-431 | 0.32 | 0.16 | 0.16 | 0.16 |
| MMT | 0.88 | 1.20 | 1.20 | 1.20 |
| o-Cl HABI | 1.40 | 1.20 | 1.20 | 1.20 |
| Sartomer ® 349 | 1.20 | 1.20 | 1.20 | 1.20 |
| NVC | 3.20 | 3.60 | 3.60 | 3.60 |
| Photomer ® 4039 | 7.20 | 6.80 | 6.80 | 6.80 |
| Vinac ® B-100 | 25.93 | 25.89 | 25.89 | 25.89 |
| 514 nm Exposure | | | | |
| Maximum Reflection Efficiency | — | 99% | 99% | 99.8% |
| Photospeed (mJ/cm$^2$) | — | 52 | 50 | 20 |
| 633 nm Exposure | | | | |

TABLE III-continued

| Ingredient (g) | Example | | | |
|---|---|---|---|---|
| | 13 | 14 | 15 | 16 |
| Maximum Reflection Efficiency | 58% | — | 94% | — |
| Photospeed (mJ/cm²) | — | — | 135 | — |

TABLE IV

| Ingredient (g) | Example | | | |
|---|---|---|---|---|
| | 17 | 18 | 19 | 20 |
| Dichloromethane | 152.0 | 152.0 | 152.0 | 152.0 |
| Methanol | 8.0 | 8.0 | 8.0 | 8.0 |
| S-4 | 0.024 | — | — | — |
| S-5 | — | 0.032 | — | — |
| S-6 | — | — | 0.032 | — |
| S-7 | — | — | — | 0.024 |
| Fluorad ® FC-431 | 0.16 | 0.16 | 0.16 | 0.16 |
| MMT | 1.20 | 1.20 | 1.20 | 1.20 |
| o-Cl HABI | 1.20 | 1.20 | 1.20 | 1.20 |
| Sartomer ® 349 | 1.20 | 1.20 | 1.20 | 1.20 |
| NVC | 3.60 | 3.60 | 3.60 | 3.60 |
| Photomer ® 4039 | 6.80 | 6.80 | 6.80 | 6.80 |
| Vinac ® B-100 | 25.89 | 25.89 | 25.89 | 25.89 |
| 514 nm Exposure | | | | |
| Maximum Reflection Efficiency | 98% | 99.8% | 99.8% | 99.7% |
| Photospeed (mJ/cm²) | 110 | 20 | 20 | 60 |

EXAMPLES 21-23

These examples demonstrate and compare use of Sensitizers S-3, S-5, and S-6 in photoresist compositions. The components of the coating formulation are:

| COMPONENT | GRAMS |
|---|---|
| Methanol | 90.0 |
| Methylene chloride | 1100.0 |
| Polyox ® WSRN-3000 | 2.85 |
| Trimethylol propane triacrylate | 41.0 |
| Trimethylol propane trimethacrylate | 144.0 |
| Poly(methyl methacrylate/ethyl acrylate methacrylicacid)(51/29/20), Wt. Ave. W.W. 40,000-47,000, Tg 80° C., Acid No. 131 | 324.0 |
| Binder A | 83.0 |
| Benzophenone | 55.0 |
| o-Cl-HABI | 27.5 |
| Leuco Crystal Violet | 2.05 |
| N-Phenyl glycine | 5.2 |
| TAOBN | 0.04 |

Binder A is prepared by the following procedure. An emulsion polymerization apparatus consisting of a 5 L, 4 necked flask equipped with a mechanical stirrer, a 1 L addition funnel, thermometer, nitrogen inlet, water cooled reflux condenser and a heating mantle is charged with 3,360 g of deionized water and 20 g of a 30% aqueous solution of sodium lauryl sulfonate and heated to 80° C. under a nitrogen atmosphere. At that temperature 25% of a mixture of 420 g of methyl methacrylate, 240 g ethyl acrylate, 165 g methacrylic acid, and 16 allyl methacrylate is added in one shot, immediately followed by 10 mL of 5% aqueous potassium persulfate and 10 mL of 7% aqueous potassium phosphate. The remainder of the monomer mixture is added over a period of 90 min while the temperature is maintained at 80°-88° C. Then the reaction is heated at 80°-85° C. for an additional 2 hr. The reaction mixture is cooled to room temperature and the product coagulated with methanol. The resulting slurry is filtered, washed twice with water and sucked dry. The resulting fine power is dried in an oven at 100° C. for 4 hr.

Three sensitizer containing coating formulations are prepared: one containing Sensitizer S-3, one containing Sensitizer S-5, and one containing Sensitizer S-6. To each of three 200 g portions of the above coating formulation is added 0.19 g of the desired sensitizer.

Each sensitizer containing coating formulation is conventionally coated onto a 0.001 in thick polyethylene terephthalate film support and dried to give a dry coated layer thickness of about 0.0015 in. A 0.001 in polyethylene coversheet is laminated to the uncovered surface of each coated layer to protect it during storage and handling.

After the protective cover sheet is removed, each coated layer is laminated to a copper clad circuit board substrate which was scrubbed with an abrasive brush, using a Riston ® hot roll laminator at about 210° F. (99° C.) at a speed of 5 ft/min (152 cm/min). Each laminated layer was imagewise exposed under vacuum to radiation having wavelengths greater than 460 nm using the filtered output of a Riston ® PC Printer. In this exposure procedure, an Air Force Resolution Target phototool and a 0.001 in thick sheet of Kapton ® polyimide film was placed over the polyethylene terephthalate support of the laminated layer in the vacuum frame of the PC Printer and irradiated to give exposures at the polyimide film surface indicated in Table V. The polyimide sheet is substantially opaque to radiation having wavelengths less than 460 nm, i.e., the sheet has an optical density of 1.6 at 460 nm, an optical density of 2 at 450 nm and higher optical densities at shorter wavelengths.

After exposure, the polyethylene terephthalate support film is removed from the laminate and the unexposed portions of the photopolymer layer are removed with a 1% by weight aqueous solution of sodium carbonate monohydrate at 85° F. (29° C.) using a Chemcut ® 547 processing system at a transport rate of about 73 in/min (185 cm/min).

TABLE V

| Sensitizer | Exposure (mJ/cm²) | $(2)^{1/6}$ Steps | Resolution[a] |
|---|---|---|---|
| S-3 | 80 | 21 | 3.1 |
| | 120 | 30 | 3.1 |
| S-5 | 80 | 25 | 2.8 |
| | 120 | 28 | 3.1 |
| S-6 | 80 | 21 | 2.2 |
| | 120 | 26 | 2.8 |

[a]width of finest lines held

What is claimed is:
1. A photosensitive composition comprising:
(a) a compound of the formula

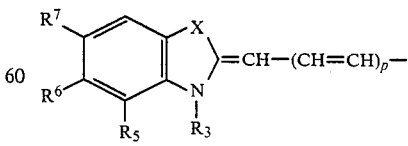

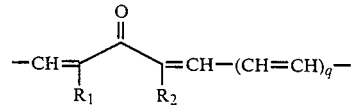

-continued

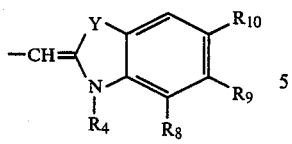

wherein:
p and q are each independently 0 or 1;
$R_1$ and $R_2$ are H, or $R_1+R_2$ is —($CHR_{11}CHR_{12}$)— or —($CH_2CHR_{13}CH_2$)—, where $R_{11}$ and $R_{12}$ are each either hydrogen or joined to form an aromatic ring and $R_{13}$ is either H or an alkyl group of about 1 to about 6 carbon atoms;
$R_3$ and $R_4$ are each independently alkyl groups of about 1 to about 6 carbon atoms or substituted or unsubstituted phenyl;
X and Y are each independently O, S, Se, $NR_{14}$, or $CR_{15}R_{16}$, where $R_{14}$, $R_{15}$, and $R_{16}$ are each independently alkyl groups of about 1 to about 6 carbon atoms or substituted or unsubstituted phenyl; and
$R_5$, $R_6$, $R_7$, $R_8$, $R_9$, and $R_{10}$ are each independently alkyl groups of about 1 to about 6 carbon atoms, alkoxy groups of about 1 to about 6 carbon atoms, substituted or unsubstituted phenyl, chlorine, or bromine, with the proviso that
$R_5$ and $R_6$ together or $R_6$ and $R_7$ together and that independently $R_8$ and $R_9$ together or $R_9$ and $R_{10}$ together may be joined to form an aliphatic or aromatic ring;
(b) an ethylenically unsaturated compound capable of free radical initiated addition polymerization; and
(c) a chain transfer agent.

2. The composition of claim 1 present as a liquid.
3. The composition of claim 1 present as a dry film.
4. The composition of claim 1 wherein p and q are each equal to zero; X and Y are identical and equal to S or $C(CH_3)_2$; $R_1+R_2$ is —($CH_2$)$_2$— or —($CH_2CHR_{13}CH_2$)—, where $R_{13}$ is H or t-butyl; $R_3$ and $R_4$ are identical and equal to $CH_3$ or $C_2H_5$; $R_7$ and $R_{10}$ are hydrogen; and $R_5$ and $R_6$ are each either hydrogen or joined to form an aromatic ring and $R_8$ and $R_9$ are each either hydrogen or joined to form an aromatic ring.
5. The composition of claim 4 wherein $R_1+R_2$ is —($CH_2$)$_2$—.
6. A photosensitive composition comprising:
(a) a compound of the formula

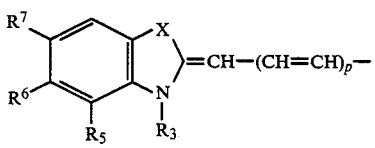

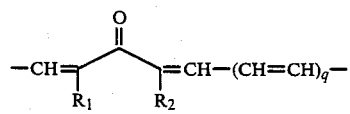

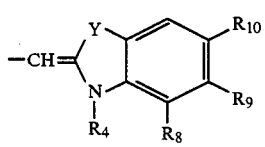

wherein:
p and q are each independently 0 or 1;
$R_1$; and $R_2$ are H, or $R_1+R_2$ is —($CHR_{11}CHR_{12}$)— or —($CH_2CHR_{13}CH_2$)—, where $R_{11}$ and $R_{12}$ are each either hydrogen or joined to form an aromatic ring and $R_{13}$ is either H or an alkyl groups of about 1 to about 6 carbon atoms;
$R_3$ and $R_4$ are each independently alkyl groups of about 1 to about 6 carbon atoms or substituted or unsubstituted phenyl;
X and Y are each independently O, S, Se, $NR_{14}$, or $CR_{15}R_{16}$, where $R_{14}$, $R_{15}$, and $R_{16}$ are each independently alkyl groups of about 1 to about 6 carbon atoms or substituted or unsubstituted phenyl; and
$R_5$, $R_6$, $R_7$, $R_8$, $R_9$, and $R_{10}$ are each independently alkyl groups of about 1 to about 6 carbon atoms, alkoxy groups of about 1 to about 6 carbon atoms, substituted or unsubstituted phenyl, chlorine, or bromine, with the proviso that
$R_5$ and $R_6$ together or $R_6$ and $R_7$ together and that independently $R_8$ and $R_9$ together or $R_9$ and $R_{10}$ together may be joined to form an aliphatic or aromatic ring;
(b) an ethylenically unsaturated compound capable of free radical initiated addition polymerization; and
(c) a free radical generating system activatible by actinic radiation said initiator system comprises a HABI and a chain transfer agent.

7. The composition of claim 6 wherein p and q are each equal to zero; X and Y are identical and equal to S or $C(CH_3)_2$; $R_1+R_2$ is —($CH_2$)$_2$— or —($CH_2CHR_{13}CH_2$)—, where $R_{13}$ is H or t-butyl; $R_3$ and $R_4$ are identical and equal to $CH_3$ or $C_2H_5$; $R_7$ and $R_{10}$ are hydrogen; and $R_5$ and $R_6$ are each either hydrogen or joined to form an aromatic ring and $R_8$ and $R_9$ are each either hydrogen or joined to form an aromatic ring.

8. The composition of claim 7 wherein $R_1+R_2$ is —($CH_2$)$_2$—.

9. A photosensitive composition comprising:
(a) a compound of the formula

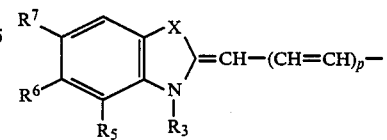

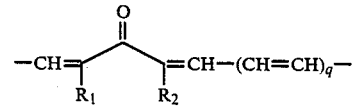

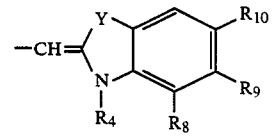

wherein:
p and q are each independently 0 or 1;
$R_1$ and $R_2$ are H, or $R_1+R_2$ is —($CHR_{11}CHR_{12}$)— or —($CH_2CHR_{13}CH_2$)—, where $R_{11}$ and $R_{12}$ are each either hydrogen or joined to form an aromatic ring and $R_{13}$ is either H or an alkyl groups of about 1 to about 6 carbon atoms;

R$_3$ and R$_4$ are each independently alkyl groups of about 1 to about 6 carbon atoms or substituted or unsubstituted phenyl;

X and Y are each independently O, S, Se, NR$_{14}$, or CR$_{15}$R$_{16}$, where R$_{14}$, R$_{15}$, and R$_{16}$ are each independently alkyl groups of about 1 to about 6 carbon atoms or substituted or unsubstituted phenyl; and R$_5$, R$_6$, R$_7$, R$_8$, R$_9$, and R$_{10}$ are each independently alkyl groups of about 1 to about 6 carbon atoms, alkoxy groups of about 1 to about 6 carbon atoms, substituted or unsubstituted phenyl, chlorine, or bromine, with the proviso that R$_5$ and R$_6$ together or R$_6$ and R$_7$ together and that independently R$_8$ and R$_9$ together or R$_9$ and R$_{10}$ together may be joined to form an aliphatic or aromatic ring;

(b) a polymeric binder;

(c) an ethylenically unsaturated compound capable of free radical initiated addition polymerization; and (d) a free radical generating system activatible by actinic radiation said initiator system comprises a HABI and a chain transfer agent.

10. The composition of claim 9 wherein p and q are each equal to zero; X and Y are identical and equal to S or C(CH$_3$)$_2$; R$_1$+R$_2$ is —(CH$_2$)$_2$— or —(CH$_2$CHR$_{13}$CH$_2$)—, where R$_{13}$ is H or t-butyl; R$_3$ and R$_4$ are identical and equal to CH$_3$ or C$_2$H$_5$; R$_7$ and R$_{10}$ are hydrogen; and R$_5$ and R$_6$ are each either hydrogen or joined to form an aromatic ring and R$_8$ and R$_9$ are each either hydrogen or joined to form an aromatic ring.

11. The composition of claim 10 wherein R$_1$+R$_2$ is —(CH$_2$)$_2$—.

12. A single step process for forming a light-stable hologram which comprises exposing to modulated actinic radiation comprising an object beam and a reference beam bearing holographic information a photopolymerizable layer comprising:

(a) a compound of the formula

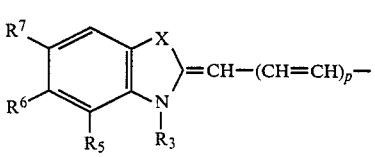

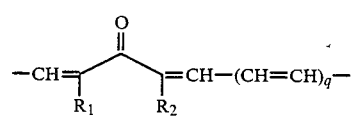

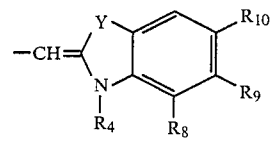

wherein:

p and q are each independently 0 or 1;

R$_1$ and R$_2$ are H, or R$_1$+R$_2$ is —(CHR$_{11}$CHR$_{12}$)— or —(CH$_2$CHR$_{13}$CH$_2$)—, where R$_{11}$ and R$_{12}$ are each either hydrogen or joined to form an aromatic ring and R$_{13}$ is either H or an alkyl groups of about 1 to about 6 carbon atoms;

R$_3$ and R$_4$ are each independently alkyl groups of about 1 to about 6 carbon atoms or substituted or unsubstituted phenyl;

X and Y are each independently O, S, Se, NR$_{14}$, or CR$_{15}$R$_{16}$, where R$_{14}$, R$_{15}$, and R$_{16}$ are each independently alkyl groups of about 1 to about 6 carbon atoms or substituted or unsubstituted phenyl; and R$_5$, R$_6$, R$_7$, R$_8$, R$_9$, and R$_{10}$ are each independently alkyl groups of about 1 to about 6 carbon atoms, alkoxy groups of about 1 to about 6 carbon atoms, substituted or unsubstituted phenyl, chlorine, or bromine, with the proviso that R$_5$ and R$_6$ together or R$_6$ and R$_7$ together and that independently R$_8$ and R$_9$ together or R$_9$ and R$_{10}$ together may be joined to form an aliphatic or aromatic ring;

(b) a solvent soluble, thermoplastic polymeric binder;

(c) at least one ethylenically unsaturated monomer capable of free radical initiated addition polymerization and having a boiling point above 100° C.; and (d) a free radical generating system activatible by actinic radiation.

13. The process of claim 12 wherein the reference beam and the object beam enter on the same side of the photopolymerizable layer to form a transmission hologram.

14. The process of claim 12 wherein the reference beam and the object beam enter on opposite sides of the photopolymerizable layer to form a reflection hologram.

15. The process of claim 12 wherein either said binder or unsaturated monomer contains a substituent selected from the group consisting of phenyl, phenoxy, naphthyl, naphthyloxy, heteroaromatic containing up to three aromatic rings, chlorine, bromine, and mixtures thereof, and the other constituent is substantially free of said substituent.

16. The process of claim 12 wherein p and q are each equal to zero; X and Y are identical and equal to S or C(CH$_3$)$_2$; R$_1$+R$_2$ is —(CH$_2$)$_2$— or —(CH$_2$CHR$_{13}$CH$_2$)—, where R is H or t-butyl; R$_3$ and R$_4$ are identical and equal to CH$_3$ or C$_2$H$_5$; R$_7$ and R$_{10}$ are hydrogen; and R$_5$ and R$_6$ are each either hydrogen or joined to form an aromatic ring and R$_8$ and R$_9$ are each either hydrogen or joined to form an aromatic ring.

* * * * *